United States Patent
Jodka (10) Patent No.: US 12,362,739 B2
(45) Date of Patent: Jul. 15, 2025

(54) DRIVER CIRCUIT AND METHOD FOR CONTROLLING A SWITCHING ELEMENT

(71) Applicant: Renesas Design (UK) Limited, Bourne End (GB)

(72) Inventor: Eduardas Jodka, Freiburg (DE)

(73) Assignee: Renesas Design (UK) Limited, Bourne End (GB)

( * ) Notice: Subject to any disclaimer, the term of this patent is extended or adjusted under 35 U.S.C. 154(b) by 96 days.

(21) Appl. No.: 18/494,093

(22) Filed: Oct. 25, 2023

(65) Prior Publication Data
US 2025/0141441 A1    May 1, 2025

(51) Int. Cl.
*H03K 17/06*    (2006.01)
*H03K 17/687*    (2006.01)

(52) U.S. Cl.
CPC ......... *H03K 17/063* (2013.01); *H03K 17/687* (2013.01); *H03K 2217/0063* (2013.01); *H03K 2217/0072* (2013.01); *H03K 2217/0081* (2013.01)

(58) Field of Classification Search
CPC .................................................. H03K 17/063
USPC .......................................................... 327/108
See application file for complete search history.

(56) References Cited

U.S. PATENT DOCUMENTS 11,196,339 B1 *  12/2021  Jodka ..................... H02M 1/08

\* cited by examiner

*Primary Examiner* — Tomi Skibinski
(74) *Attorney, Agent, or Firm* — SCULLY, SCOTT, MURPHY & PRESSER, P.C.

(57) ABSTRACT

A driver circuit for controlling a switching element is provided. The driver circuit (200) has a plurality of bootstrap capacitors (210) and a switching unit (211). Furthermore, the driver circuit (200) has a control unit (102) which is configured to control the switching unit (211) in dependence of a control signal ($Act_{HS}$) to provide a parallel arrangement of the plurality of bootstrap capacitors (210) between a charging voltage ($V_{DD}$) and a reference voltage, for charging the plurality of bootstrap capacitors (210) during a charging phase; and to provide a serial arrangement of the plurality of bootstrap capacitors (210) between the charging voltage ($V_{DD}$) and a control port of the switching element ($M_{HS}$), for controlling the switching element ($M_{HS}$) during a control phase.

14 Claims, 5 Drawing Sheets

DRIVER CIRCUIT AND METHOD FOR CONTROLLING A SWITCHING ELEMENT

TECHNICAL FIELD

The present document relates to a driver circuit and a corresponding method for controlling a switching element.

BACKGROUND

The control and drive of a switching element, notably a transistor, which is not referenced to ground presents multiple challenges. Power conversion topologies, such as a buck-converter and/or a half-bridge converter topology, comprise one or more high-side switching elements which are not referenced to ground. A bootstrap driver circuit may be used to generate a voltage which is sufficient to drive a high-side switching element, wherein the bootstrap driver circuit typically comprises a bootstrap capacitor for generating the voltage for controlling the high-side switching element.

The bootstrap capacitor of a bootstrap driver circuit may need to have a relatively high capacitance in order to provide a sufficiently high voltage for driving a high-side switching element. This may lead to a relatively high cost and chip area.

The present document addresses the technical problem of reducing the capacitance of a bootstrap capacitor of a driver circuit for driving a switching element. The technical problem is solved by the independent claims. Preferred examples are described in the dependent claims.

SUMMARY

According to an aspect, a driver circuit for controlling a switching element is described. The driver circuit comprises a plurality of bootstrap capacitors and a switching unit. Furthermore, the driver circuit comprises a control unit which is configured to control the switching unit in dependence of a control signal, wherein the switching unit is controlled to provide a parallel arrangement of the plurality of bootstrap capacitors between a charging voltage and a reference voltage, for charging the plurality of bootstrap capacitors during a charging phase; and to provide a serial arrangement of the plurality of bootstrap capacitors between the charging voltage and a control port of the switching element, for controlling the switching element during a control phase.

According to a further aspect, a method for controlling a switching element using a plurality of bootstrap capacitors is described. The method comprises providing a parallel arrangement of the plurality of bootstrap capacitors between a charging voltage and a reference voltage, for charging the plurality of bootstrap capacitors during a charging phase, and providing a serial arrangement of the plurality of bootstrap capacitors between the charging voltage and a control port of the switching element, for controlling the switching element during a control phase.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

SHORT DESCRIPTION OF THE FIGURES

The invention is explained below in an exemplary manner with reference to the accompanying drawings, wherein.

DETAILED DESCRIPTION

Figure 1A:
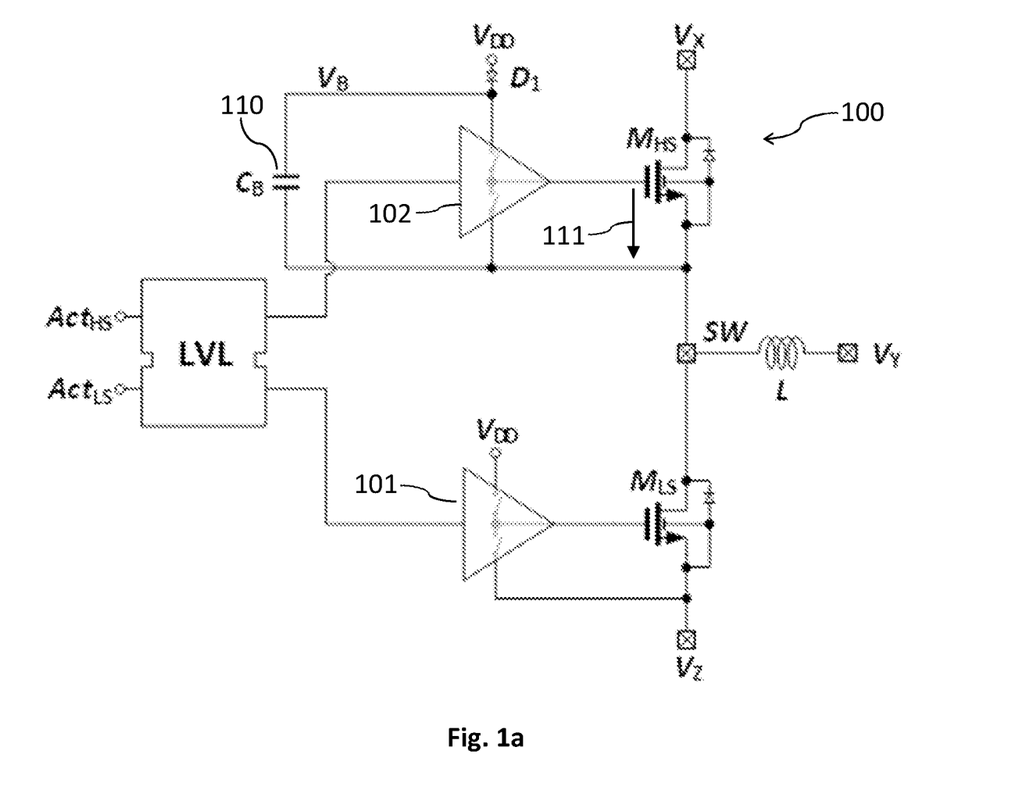
FIG. 1a illustrates an example power converter.

As indicated above, the present document is directed at providing a particularly compact and efficient driver circuit for driving a switching element which is not referenced to ground. In this context, FIG. 1a shows an example DC/DC power converter 100. Depending on the converter topology, the terminal notes $V_X$, $V_Y$ and $V_Z$ may correspond to the following voltage values
    Buck configuration: $V_X=V_{IN}$, $V_Y=V_{OUT}$ and $V_Z$=GND;
    Boost configuration: $V_X=V_{OUT}$, $V_Y=V_{IN}$ and $V_Z$=GND; and/or
    Inverting Buck-Boost configuration: $V_X=V_{IN}$, $V_Y$=GND and $V_Z=V_{OUT}$.

$V_{IN}$, $V_{OUT}$ and GND denote the input voltage, the output voltages and the ground potential, respectively. Converter output voltage regulation may be achieved via duty-cycled operation of the power stage, which involves controlling the low-side power switching element $M_{LS}$ and the high-side power switching element $M_{HS}$. The switching elements may be field effect transistors (FETs). The switching elements are controlled via respective gate drivers 101, 102. The conversion of the digital control signals $Act_{LS}$ and $Act_{HS}$ to the corresponding supply domain of the respective gate drivers 101, 102 may be performed using a level shifter 'LVL'.

The power stage, i.e., the switching elements $M_{LS}$ and $M_{HS}$, may be implemented using NMOS transistors. An n-type high-side switching element may be used because of its relatively small area (due to an increased charge mobility) and its relatively low gate capacitance as compared to a p-type switching element. Using an NMOS transistor as a high-side switching element typically requires the use of a bootstrapped gate driver 102 with a bootstrap capacitor $C_B$ 110, to account for the movement of the voltage level (i.e., the reference voltage) of the switch-node SW.

It is typically desirable to charge the bootstrap capacitor $C_B$ 110 to a relatively high voltage in order to ensure an efficient charge re-distribution when the high side switching element $M_{HS}$ is turned on. Depending on the converter topology and the technical environment that the switching element is operated in, different voltage sources for charging the bootstrap capacitor $C_B$ 110 may be available. As an example, in case of a buck converter, the input voltage of the buck converter may supply and/or charge the bootstrap capacitor $C_B$ 110. The input voltage may e.g., be provided by a Lithium-Ion battery of a portable device.

A mathematical expression of the gate-source voltage 111 (i.e., of the control voltage) of the high-side switching element $M_{HS}$, which results from the charge re-distribution between the capacitance $C_B$ of the bootstrap capacitor 110 and the gate capacitance $C_{gg}$ of the high-side switching element, may be as follows (when ignoring the voltage drop at the diode $D_1$)

$$V_{gs} = \frac{Q_B}{C_{total}} = \frac{Q_B}{C_{gg} + C_B} = \frac{V_{DD} \cdot C_B}{C_{gg} + C_B}$$

wherein $Q_B$ represents the charge across the bootstrap capacitor 110, wherein $C_{total}$ represents the total capacitance after charge re-distribution, which consists of the gate capacitance $C_{gg}$ of the high-side switching element and the capacitance $C_B$ of the bootstrap capacitor 110. $V_{DD}$ represents the charging voltage that the bootstrap capacitor 110 is charged to prior to the beginning of the charge-redistribution. Charge-redistribution from the bootstrap capacitor 110 to the gate capacitance leads to the gate-source voltage $V_{gs}$ 111 of the high-side switching element.

In an example, a switching cycle for operating the power converter 100 may start with the low-side switching element $M_{LS}$ being activated, e.g. using a gate-source voltage $V_{GS,LS}\approx4V$. As the switch-node SW is being pulled to ground by the low-side switching element $M_{LS}$, the bootstrap capacitor 110 is charged using the charging voltage $V_{DD}$, e.g., to $V_{CB}\approx4.8V$. After the low-side switching element $M_{LS}$ is turned off, the high-side switching element $M_{HS}$ is turned on, bringing the switch-node SW to a high state (e.g., to the voltage level of the terminal node $V_X$). The gate-source voltage 111 of the high-side switching element is the result of the charge re-distribution between the bootstrap capacitor 110 and the gate capacitance of the high-side switching element $M_{HS}$. Hence, when turning on the high-side switching element, the voltage across the bootstrap capacitor 110 drops from its initial value, e.g., $V_{CB}\approx4.8V$, to a reduced value, e.g. $V_{CB}=V_{GS,HS}\approx4$ V.

Figure 1B:
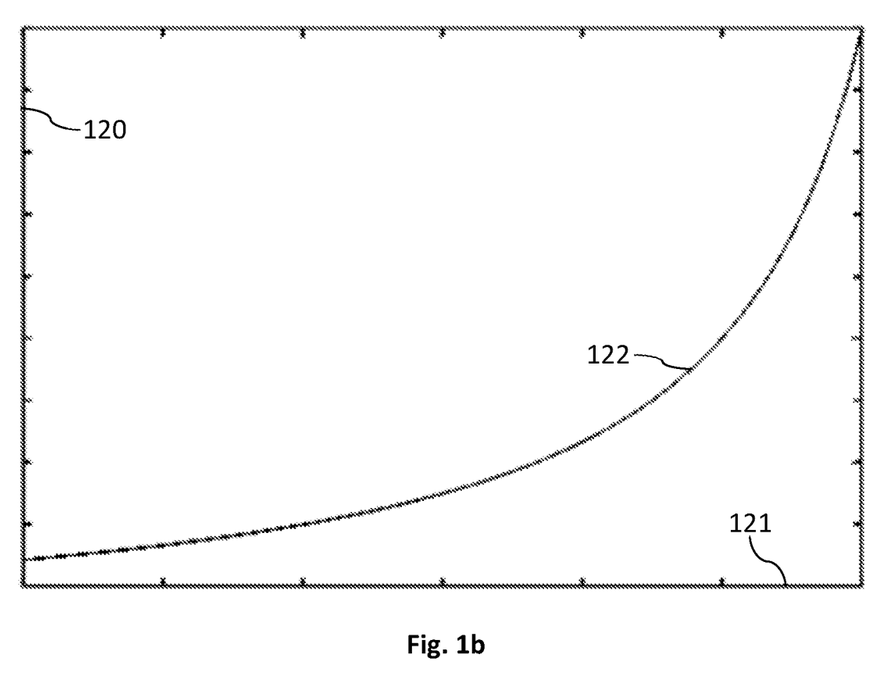
FIG. 1b shows an example relationship between the target voltage for driving a switching element and the required capacitance of the bootstrap capacitor.

The size, in particular the capacitance, of the bootstrap capacitor 110 that is needed for providing a certain target gate-source voltage for controlling the high-side switching element is depicted in FIG. 1*b*. It can be seen that the capacitance 120 of the bootstrap capacitor 110 increases significantly with increasing target values 121 for the gate-source voltage 111 (according to the relationship 122). The required capacitance 120 of the bootstrap capacitor 110 typically depends on the gate capacitance $C_{gg}$ of the high-side switching element and/or on the bootstrap capacitor charging voltage $V_{DD}$.

In the present document, a bootstrapped high-side driver circuit is described, which is configured to generate relatively high gate-source voltages 111 for controlling a high-side switching element in an area-efficient manner.

Figure 2A:
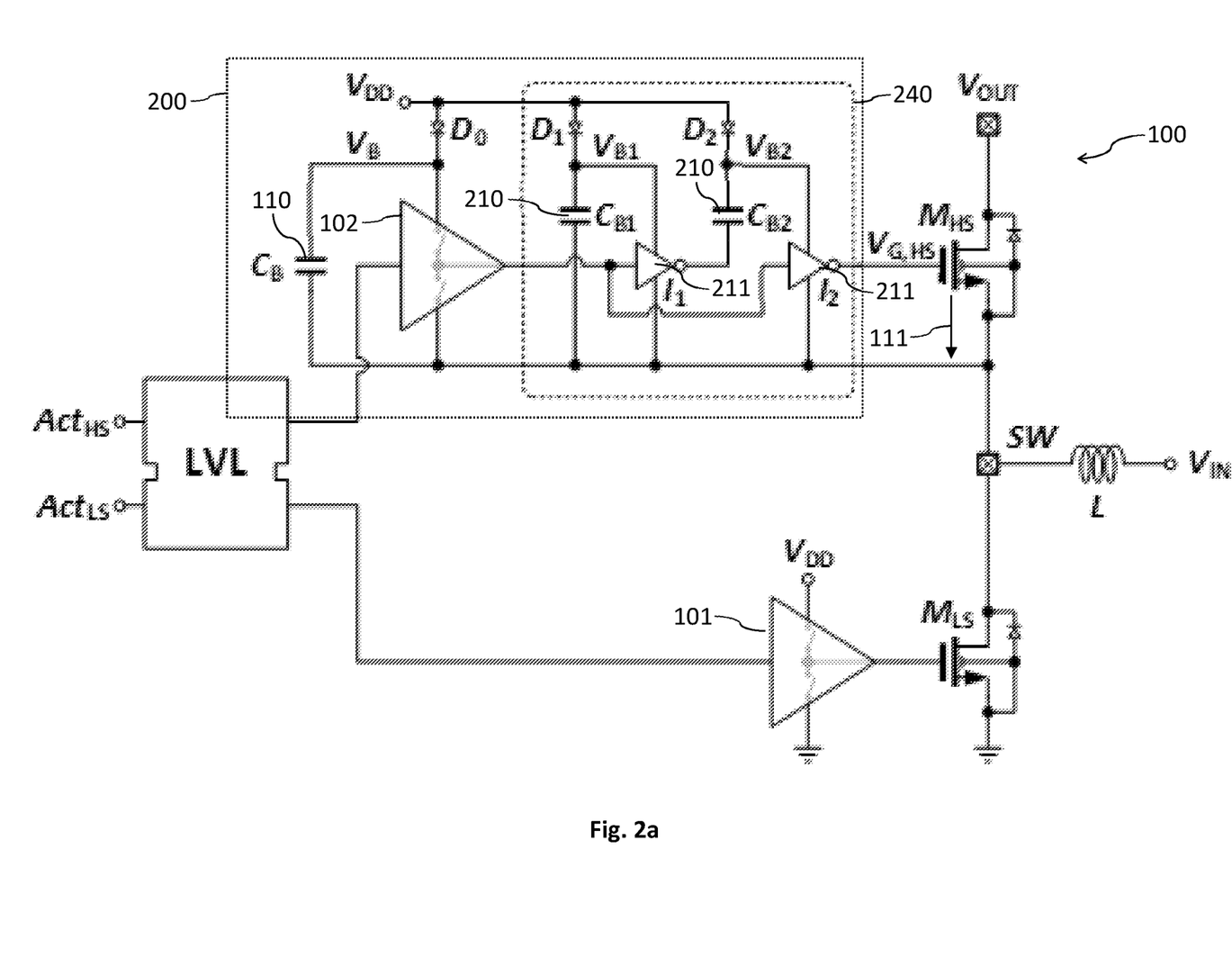
FIG. 2a shows an example power converter with a driver circuit comprising a cascade of bootstrap capacitors.

FIG. 2*a* shows an example power converter 100 with a bootstrapped high-side driver circuit 200 for driving a high-side switching element. The driver circuit 200 is configured to provide a relatively large gate-source voltage 111 for controlling the high-side switching element using a relatively small bootstrap capacitor 110. For this purpose, the driver circuit 200 comprises multiple bootstrap capacitors 110, 210, 210, in particular a basic bootstrap capacitor 110 and two or more (additional) bootstrap capacitors $C_{B1}$, $C_{B2}$ 210. The basic bootstrap capacitor 110 is not used for driving the gate of the high-side switching element, thereby allowing the size of the basis bootstrap capacitor 110 to be substantially reduced. The two or more (additional) bootstrap capacitors $C_{B1}$, $C_{B2}$ 210 are used for driving the gate of the high-side switching element.

Recharging of all the bootstrap capacitors 110, 210 is performed by coupling the bottom plate of each bootstrap capacitor 110, 210 to the switch-node SW and by charging the top plate of each bootstrap capacitor 110, 210 up to the charging voltage $V_{DD}$. During the turn-on phase of the high-side switching element, the driver circuit 200 performs capacitor stacking by connecting the bootstrap capacitors $C_{B1}$, $C_{B2}$ 210 in series using a switching unit 211 (in contrast to the parallel arrangement which is used for charging). This leads to a voltage 'pile-up' effect for providing an increased gate-source voltage 111 at the high-side switching element.

FIG. 2*a* shows an example power converter 100 in a boost converter topology. A switching cycle may start with the low-side switching element being activated (e.g., using $V_{GS,LS}\approx4V$). As the switch-node SW is pulled to ground by the low-side switching element, all the bootstrap capacitors $C_B$, $C_{B1}$, $C_{B2}$ 110, 210 are arranged in parallel and may each be charged to a given voltage, e.g., $V_{CB}\approx4.8V$. After the low-side switching element has been turned off, the high-side switching element may be turned on, thereby bringing the switch-node SW to the high state. The gate-source voltage 111 of the high-side switching element is the result of the charge re-distribution between the bootstrap capacitor stack formed by the (additional) bootstrap capacitors $C_{B1}$, $C_{B2}$ 210 and the gate capacitance $C_{gg}$ of the high-side switching element. Thus, during the high-side turn on, the voltage across each individual (additional) bootstrap capacitor 210 drops from its initial value of $V_{CB}\approx4.8V$ to its new value, which may be half the gate-source voltage 111 of the high-side switching element, e.g., $V_{CB}1=V_{CB}2=0.5\times V_{GS,HS}\approx2V$, while the gate-source voltage 111 itself is the sum of the voltages across each (additional) bootstrap capacitor 210, e.g., $V_{GS,HS}=V_{CB1}+V_{CB2}\approx4$ V. The basic bootstrap capacitor $C_B$ 110 is not involved in driving the high-side switching element, but may be used for the control of the driver circuitry 102. The voltage of the basic bootstrap capacitor 110 may remain relatively constant throughout the low-side (i.e., charging) and the high-side (i.e., control) phases.

A mathematical expression of the gate-source voltage $V_{gs}$ 111 of the high-side switching element, which results from charge re-distribution from the bootstrap capacitor stack 240 formed by the (additional) bootstrap capacitors $C_{B1}$, $C_{B2}$ 210 to the gate capacitance $C_{gg}$ of the high-side switching element may be given by (when ignoring the voltage drop at the diodes $D_1$, $D_2$):

$$V_{gs} = \frac{V_{DD} \cdot C_{B,1/2}}{2 \times C_{gg} + 0.5 \times C_{B,1/2}}$$

wherein $C_{B,1/2}$ is the total bootstrap capacitance of the gate driver and consists of the two (in general the K) individual (additional) bootstrap capacitors $C_{B1}$, $C_{B2}$ 210.

Figure 2B:
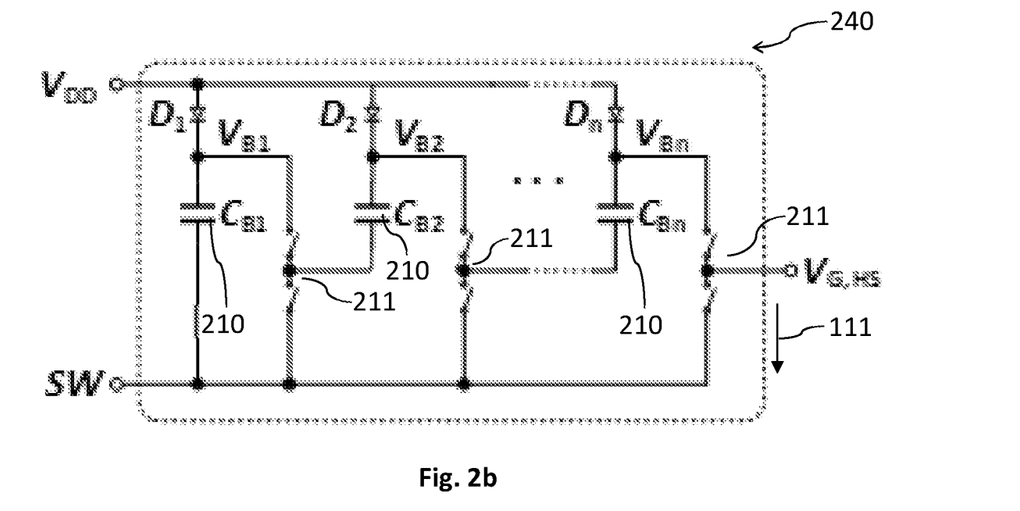
FIG. 2b shows an example cascade of bootstrap capacitors.
Figure 2C:
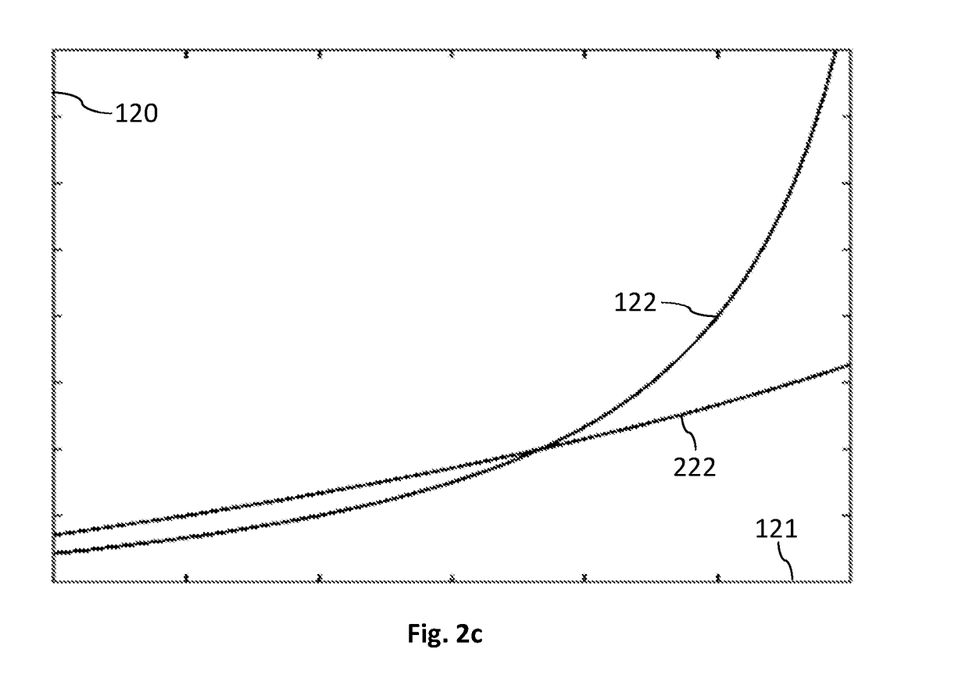
FIG. 2c shows an example relationship between the target voltage for driving a switching element and the required capacitance of the bootstrap capacitor.

The size 120 of a total bootstrap capacitor which is needed to achieve a certain target value 121 of the gate-source voltage 111 of the high-side switching element 111 is depicted in FIG. 2*c*. It can be seen that when using the stacked-capacitor implementation (relationship 222), the size 120 of the total bootstrap capacitor may be reduced significantly, in particular for relatively high target values 121 of the gate-source voltage 111. In particular, it can be seen that the relationship 222 between the value 120 of the bootstrap capacitor and the resulting value 121 of the gate-source voltage 111 of the high-side switching element has a more gradual curvature compared to the relationship 122. As the target value 121 for the gate-source voltage 111 of the high-side switching element is approaching the nominal value of the charging voltage $V_{DD}$ of the bootstrap capacitors 210, a significantly smaller bootstrap capacitor size may be needed when using stacked bootstrap capacitors 210.

As can be seen from FIG. 2c, it may be more advantageous to use a single bootstrap capacitor 110, when a relatively small gate-source voltage 111 of the high-side switching element is targeted. However, as the target gate-source voltage goes above a certain threshold value, e.g., ~3.5V, the stacked-capacitor implementation yields a smaller overall bootstrap capacitor size. For example:
at $V_{GS,HS}$=3.6V, the stacked-capacitor implementation may yield a 15% reduction;
at $V_{GS,HS}$=4V, the stacked-capacitor implementation may yield a 50% reduction.

The charging voltage $V_{DD}$ of the bootstrap capacitor may exhibit a range with a minimum boundary and a maximum boundary. The maximum boundary may be defined by the oxide thickness of the bootstrap capacitor 110, 210, wherein an increased oxide thickness typically leads to an increased maximum boundary. The minimum boundary may be defined by the source from which the charging voltage $V_{DD}$ is generated (for example, if the charging voltage $V_{DD}$ is generated from a Lithium-Ion battery, the minimum boundary may be 2 . . . 3V). The stacked-capacitor implementation, which is described herein, enables the generation of gate-source voltages 111 at target voltage levels 121 which are above the charging voltage $V_{DD}$ of the bootstrap capacitor 110, 210 itself. This may be beneficial when the charging voltage $V_{DD}$ of the bootstrap capacitors 110, 210 is relatively close to its minimum boundary.

FIG. 2b illustrates an example capacitor circuit 240, which comprises a plurality of bootstrap capacitors $C_{B1}$, $C_{B1}$, . . . , $C_{Bn}$ 210 and a switching unit 211 which is configured to
provide a parallel arrangement of the bootstrap capacitors $C_{B1}$, $C_{B1}$, . . . , $C_{Bn}$ 210 between the charging voltage $V_{DD}$ and the reference voltage (which corresponds to the voltage of the switch-node SW) during a charging phase, for charging the individual bootstrap capacitors $C_{B1}$, $C_{B1}$, . . . , $C_{Bn}$ 210 to a capacitor voltage (which is typically substantially equal to the charging voltage $V_{DD}$); and
provide a serial arrangement of the bootstrap capacitors $C_{B1}$, $C_{B1}$, . . . , $C_{Bn}$ 210 between the charging voltage $V_{DD}$ and the control port, notably the gate, of the switching element during a control phase, for generating the control voltage 111, notably the gate-source voltage, for controlling the switching element.

The steering of the bottom and/or top plates of the bootstrap capacitors $C_{B1}$, $C_{B1}$, . . . , $C_{Bn}$ 210 may be implemented via inverters as shown in FIG. 2a and/or via switches as shown in FIG. 2b.

Figure 3:
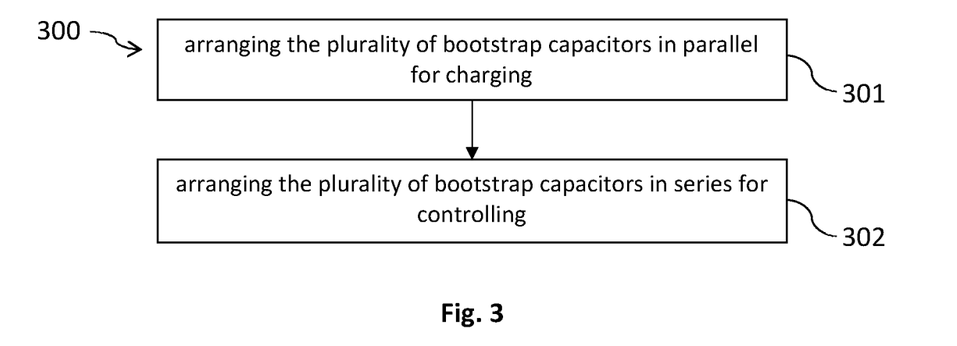
FIG. 3 shows a flow chart of an example method for controlling a switching element using a plurality of bootstrap capacitors.

FIG. 3 shows a flow chart of a (possibly computer implemented) method 300 for controlling a switching element $M_{HS}$ (which is not referenced to ground GND) using a plurality of bootstrap capacitors 210. The method 300 comprises providing 301 a parallel arrangement of the plurality of bootstrap capacitors 210 between a charging voltage $V_{DD}$ and a reference voltage, for charging the plurality of bootstrap capacitors 210 during a charging phase. In particular, the parallel arrangement of the plurality of bootstrap capacitors 210 may be arranged between the charging voltage $V_{DD}$ and the switch node SW of the power converter 100 which comprises the switching element $M_{HS}$. Hence, the voltage across each one of the bootstrap capacitors 210 of the plurality of bootstrap capacitors 210 may be equal and may substantially correspond to the charging voltage $V_{DD}$ (as the reference voltage may correspond to ground GND during the charging phase).

The method 300 further comprises providing 302 a serial arrangement of the plurality of bootstrap capacitors 210 between the charging voltage $V_{DD}$ and the control port (in particular the gate) of the switching element $M_{HS}$, for controlling the switching element $M_{HS}$ during a control phase. As a result of this, a relatively high control voltage 111 for controlling, in particularly for closing, the switching element $M_{HS}$ may be provided in an efficient manner (using a relatively small overall capacitance of the plurality of bootstrap capacitors 210).

Hence, a driver circuit 200 for controlling a switching element $M_{HS}$ (which is not referenced to ground) is described. The switching element $M_{HS}$ may be a high-side switching element of the power converter 100. Alternatively, or in addition, the switching element $M_{HS}$ may be an n-type metal oxide semiconductor (MOS) field effect transistor (FET).

The driver circuit 200 comprises a plurality of bootstrap capacitors 210 and a switching unit 211. The plurality of bootstrap capacitors 210 may comprise two or more, in particular three or more, bootstrap capacitors 210. The capacitance of the individual bootstrap capacitors 210 of the plurality of bootstrap capacitors 210 may be substantially equal. The switching unit 211 may comprise one or more inverters, and/or one or more switches. In particular, the switching unit 211 may be configured to provide different arrangements, such as a parallel arrangement and a serial arrangement, of the plurality of bootstrap capacitors 210.

The driver circuit 200 comprises a control unit 102 which is configured to control the switching unit 211 in dependence of a (possibly digital) control signal $Act_{HS}$. In particular, the switching unit 211 may be controlled to provide the parallel arrangement of the plurality of bootstrap capacitors 210 between the charging voltage $V_{DD}$ and the reference voltage, for charging the plurality of bootstrap capacitors 210 during a charging phase. The K bootstrap capacitors 210 of the plurality of bootstrap capacitors 210 may be arranged in parallel to one another (with K≥2 or K≥3), such that each one of the K bootstrap capacitors 210 is arranged between the charging voltage $V_{DD}$ and the reference voltage. By doing this, each one of the K bootstrap capacitors may be charged to a capacitor voltage level (which may substantially correspond to the charging voltage $V_{DD}$).

Furthermore, the switching unit 211 may be controlled to provide a serial arrangement of the plurality of bootstrap capacitors 210 between the charging voltage $V_{DD}$ and the control port, in particular the gate, of the switching element $M_{HS}$, for controlling the switching element $M_{HS}$ during a control phase. By doing this, a control voltage 111, notable a gate-source voltage, may be applied to the control port of the switching element $M_{HS}$. The serial arrangement of the plurality of bootstrap capacitors 210 leads to a situation where the voltage across the plurality of bootstrap capacitors 210 corresponds to K times the capacitor voltage (prior to charge-redistribution). This increased voltage across the plurality of bootstrap capacitors 210 may be used to generate a relatively high control voltage 111 in an efficient manner, notably with a relatively low overall capacitance of the plurality of bootstrap capacitors 210.

The reference voltage may be different, in particular lower, during the charging phase with the parallel arrangement of the plurality of bootstrap capacitors 210 than during the control phase with the serial arrangement of the plurality of bootstrap capacitors 210. In particular, the reference voltage may correspond to a first potential of a first terminal node $V_X$ (during the control phase) and to a second potential, notably ground, of a second terminal node $V_Z$ (during the charging phase).

The control unit 102 may be configured to control the switching unit 211 to provide the parallel arrangement of the plurality of bootstrap capacitors 210, if the control signal $Act_{HS}$ indicates that the switching element $M_{HS}$ is to be open. Furthermore, the control unit 102 may be configured to control the switching unit 211 to provide the serial arrangement of the plurality of bootstrap capacitors 210, if the control signal Actus indicates that the switching element $M_{HS}$ is to be closed. Hence, the switching element $M_{HS}$ may be open during the charging phase and may be closed during the control phase.

The control unit 102 may be configured to control the switching unit 211 to operate the plurality of bootstrap capacitors 210 in a sequence of switching cycles. A, in particular each, switching cycle may comprise a charging phase and a subsequent control phase, in particular exactly one charging phase and exactly one subsequent control phase. By doing this, an efficient continuous operation of the driver circuit 200 may be provided.

The driver circuit 200 may be configured such that the individual bootstrap capacitors 210 of the plurality of bootstrap capacitors 210 are each charged to the capacitor voltage level during the charging phase with the parallel arrangement of the plurality of bootstrap capacitors 210. The capacitor voltage level is typically smaller than the charging voltage $V_{DD}$. Furthermore, the driver circuit 200 may be configured such that the control voltage 111 for controlling the switching element $M_{HS}$, which is provided during the control phase by the serial arrangement of the plurality of bootstrap capacitors 210, is higher than the charging voltage $V_{DD}$. As a result of this, a particularly reliable control of the switching element $M_{HS}$ may be provided.

The driver circuit 200 may further comprise a basic bootstrap capacitor 110 which is arranged between the charging voltage $V_{DD}$ and the reference voltage during the charging phase and during the control phase, in particular which is arranged permanently between the charging voltage $V_{DD}$ and the reference voltage. The basic bootstrap capacitor 110 may be configured to supply the control unit 102 with electrical energy for operation of the control unit 102. By providing a basic bootstrap capacitor 110, the reliability of the driver circuit 200 may be increased.

Furthermore, a power converter 100 is described which comprises a switching element $M_{HS}$ and a driver circuit 200 for controlling the switching element $M_{HS}$. The driver circuit 200 may be configured as described in the present document.

The switching element $M_{HS}$ may be arranged between a first terminal node $V_X$ and a switch node SW of the power converter 100. The switch node SW may exhibit a reference voltage which varies between a first potential of the first terminal node $V_X$ and a second potential, notably ground, of a second terminal node $V_Z$ of the power converter 100.

The driver circuit 200 may be configured to control the switching unit 211 to arrange the parallel arrangement of the plurality of bootstrap capacitors 210 between the charging voltage $V_{DD}$ and the switch node SW during the charging phase, thereby providing a reliable charging of the K bootstrap capacitors 210.

The driver circuit 200 which is described in the present document comprises bootstrap capacitors $C_{B1}$, $C_{B2}$ 210 which are used for providing the gate-source voltage 111 of the high-side switch through charge-redistribution. The switching unit 211 may comprise CMOS inverter cell $I_1$ for connecting the bottom plate of the bootstrap capacitor $C_{B2}$ either to the top plate of the bootstrap capacitor $C_{B1}$ (to provide the serial arrangement) or to the switch-node SW (to provide the parallel arrangement). Furthermore, the switching unit 211 may comprise a CMOS inverter cell $I_2$ for connecting the gate of the high-side switch $V_{G,HS}$ either to the top plate of the bootstrap capacitor $C_{B2}$ (for the control phase) or to the switch-node SW (for the charging phase).

Furthermore, a plurality of diodes $D_1$, $D_2$ may be used for the corresponding plurality of bootstrap capacitors 210 for providing a recharge path (from the charging voltage $V_{DD}$) for recharging the bootstrap capacitors $C_{B1}$, $C_{B2}$.

A more generic core circuit structure 240 of the cascaded switched capacitive boosting stage is shown in FIG. 2b.

The sequential method of operation may be as follows:
1. During the low-side turn-on, the switch-node SW may be pulled down to ground;
2. The switching unit 211, notably the inverter $I_1$, may connect the bottom plate of the bootstrap capacitor $C_{B2}$ to the switch-node SW and the switching unit 211, notably the inverter $I_2$, may connect the gate terminal of the high-side switch to the switch-node SW, thereby keeping the high-side switch turned off;
3. All bootstrap capacitors $C_B$, $C_{B1}$, $C_{B2}$ 210 may be charged from the charging voltage $V_{DD}$ through the respective diodes $D_0$, $D_1$, $D_2$;
4. During the subsequent control phase, the low-side switch may be turned off;
5. The switching unit 211, notably the inverter $I_1$, may connect the top plate of the bootstrap capacitor $C_{B1}$ to the bottom plate of the bootstrap capacitor $C_{B2}$, and the switching unit 211, notably the inverter $I_2$, may connect the gate terminal of the high-side switch to the top plate of the bootstrap capacitor $C_{B2}$, thereby turning on the high-side switch;
6. The high-side switch turn-on brings up the switch-node SW.

The proposed stacked bootstrap capacitor scheme is particularly beneficial when the target gate-source voltage of the high-side switch is relatively close to the charging voltage $V_{DD}$ of the bootstrap capacitors. Furthermore, the described scheme is beneficial when the target gate-source voltage of the high-side switch is higher than the charging voltage $V_{DD}$ of the bootstrap capacitors.

The structure of the proposed stacked bootstrap capacitor scheme is modular and may be scaled to comprise multiple capacitor stages, depending on the technical environment and the application needs. The different capacitive boosting stages may be switched via inverters and/or switches. The driver circuit 200 may be tied to the switch-node SW and/or may be referred to a different potential, thereby supporting various DC/DC converter and output stage topologies. The proposed stacked bootstrap capacitor scheme may enable efficient power stage operation in the presence of relatively low charging voltages, thereby extending the supported duty-cycle range of a DC/DC converter 100 in an efficient manner.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

The invention claimed is:

1. A driver circuit for controlling a switching element, the driver circuit comprising:
    a plurality of bootstrap capacitors;
    a switching unit; and
    a control unit which is configured to control the switching unit in dependence of a control signal to
        provide a parallel arrangement of the plurality of bootstrap capacitors between a charging voltage and a reference voltage, for charging the plurality of bootstrap capacitors during a charging phase; and
        provide a serial arrangement of the plurality of bootstrap capacitors between the charging voltage and a control port of the switching element, for controlling the switching element during a control phase.

2. The driver circuit of claim 1, wherein the control unit is configured to control the switching unit to
    provide the parallel arrangement of the plurality of bootstrap capacitors, if the control signal indicates that the switching element is to be open; and
    provide the serial arrangement of the plurality of bootstrap capacitors, if the control signal indicates that the switching element is to be closed.

3. The driver circuit of claim 1, wherein:
    the driver circuit further comprises a basic bootstrap capacitor which is arranged between the charging voltage and the reference voltage during the charging phase and during the control phase, in particular which is arranged permanently between the charging voltage and the reference voltage; and
    the basic bootstrap capacitor is configured to supply the control unit with electrical energy for operation of the control unit.

4. The driver circuit of claim 1, wherein the driver circuit is configured such that
    the individual bootstrap capacitors of the plurality of bootstrap capacitors are each charged to a capacitor voltage level during the charging phase with the parallel arrangement of the plurality of bootstrap capacitors; wherein the capacitor voltage level is smaller than the charging voltage; and
    a control voltage for controlling the switching element, which is provided during the control phase by the serial arrangement of the plurality of bootstrap capacitors, is higher than the charging voltage.

5. The driver circuit of claim 1, wherein:
    the driver circuit is configured to provide a control voltage to the control port of the switching element during the control phase, using the serial arrangement of the plurality of bootstrap capacitors;
    the control port is a gate of the switching element; and
    the control voltage is a gate-source voltage.

6. The driver circuit of claim 1, wherein the plurality of bootstrap capacitors comprises two or more, in particular three or more, bootstrap capacitors.

7. The driver circuit of claim 1, wherein the reference voltage is different, in particular lower, during the charging phase with the parallel arrangement of the plurality of bootstrap capacitors than during the control phase with the serial arrangement of the plurality of bootstrap capacitors.

8. The driver circuit of claim 1, wherein the switching unit comprises:
    one or more inverters; and/or
    one or more switches.

9. The driver circuit of claim 1, wherein a capacitance of the individual bootstrap capacitors of the plurality of bootstrap capacitors is substantially equal.

10. The driver circuit of claim 1, wherein:
    the control unit is configured to control the switching unit to operate the plurality of bootstrap capacitors in a sequence of switching cycles; and
    a, in particular each, switching cycle comprises a charging phase and a subsequent control phase, in particular exactly one charging phase and exactly one subsequent control phase.

11. A power converter comprising:
    a switching element; and
    a driver circuit according to claim 1 for controlling the switching element.

12. The power converter of claim 11, wherein:
    the switching element is arranged between a first terminal node and a switch node of the power converter;
    the switch node exhibits a reference voltage which varies between a first potential of the first terminal node and a second potential of a second terminal node of the power converter; and
    the driver circuit is configured to control the switching unit to arrange the parallel arrangement of the plurality of bootstrap capacitors between the charging voltage and the switch node during the charging phase.

13. The power converter of claim 11, wherein:
    the switching element is a high-side switching element of the power converter; and/or
    the switching element is an n-type metal oxide semiconductor field effect transistor.

14. A method for controlling a switching element using a plurality of bootstrap capacitors, the method comprising:
    providing a parallel arrangement of the plurality of bootstrap capacitors between a charging voltage and a reference voltage, for charging the plurality of bootstrap capacitors during a charging phase; and
    providing a serial arrangement of the plurality of bootstrap capacitors between the charging voltage and a control port of the switching element, for controlling the switching element during a control phase.

* * * * *